United States Patent [19]
Liu et al.

[11] Patent Number: 6,031,256
[45] Date of Patent: Feb. 29, 2000

[54] WIDE VOLTAGE OPERATION REGIME DOUBLE HETEROJUNCTION BIPOLAR TRANSISTOR

[75] Inventors: Wen-Chan Liu; Shiou-Ying Cheng, both of Tainan, Taiwan

[73] Assignee: National Science Council of Republic of China, Taiwan

[21] Appl. No.: 09/225,313

[22] Filed: Jan. 5, 1999

[51] Int. Cl.$^7$ ............................................. H01L 31/0328
[52] U.S. Cl. ........................... 257/198; 257/12; 257/14; 257/15; 257/22; 257/197; 257/201; 257/615
[58] Field of Search ................................. 257/197, 198, 257/25, 9, 12, 14, 15, 22, 201, 613, 615

[56] References Cited

U.S. PATENT DOCUMENTS

| | | | |
|---|---|---|---|
| 5,151,618 | 9/1992 | Yokoyama et al. | 257/197 |
| 5,365,077 | 11/1994 | Metzger et al. | 257/15 |
| 5,389,798 | 2/1995 | Ochi et al. | 257/25 |
| 5,389,804 | 2/1995 | Yokoyama et al. | 257/197 |
| 5,459,331 | 10/1995 | Izumi | 257/17 |
| 5,828,077 | 10/1998 | Liu et al. | 257/25 |

FOREIGN PATENT DOCUMENTS

| | | | |
|---|---|---|---|
| 314836 | 5/1989 | European Pat. Off. | 257/197 |
| 359508 | 3/1990 | European Pat. Off. | 257/197 |
| 1-251661 | 10/1989 | Japan | 257/197 |
| 1-262663 | 10/1989 | Japan | 257/197 |
| 3-14240 | 1/1991 | Japan | 257/197 |

*Primary Examiner*—Jerome Jackson, Jr.
*Assistant Examiner*—Bradley William Bahmeister
*Attorney, Agent, or Firm*—Bacon & Thomas, PLLC

[57] ABSTRACT

Structure of a wide voltage operation regime double heterojunction bipolar transistor, specifically a modified InGaP/GaAs double heterojunction bipolar transistor featuring a very broad collector-emitter voltage operation range, an invention of high speed, low power consumption and high breakdown voltage rated microwave power transistor. Unique in the incorporation of $In_{0.49}Ga_{0.51}P$ collector layer, GaAs delta-doping sheet and undoped GaAs spacer in the collector zone. The introduction of a spacer with a delta doping sheet into the effective base-collector heterojunction serves to eliminate potential spike from appearing at base-collector interfacing any more, thus effectively precludes electron blocking effect. In the emitter zone the inventive design comprises a five-period $In_{0.49}Ga_{0.51}P$/GaAs superlatticed confinement layer to GaAs emitter homojunction, with superlatticed confinement layer functioning as a containment layer for minority (hole), while the base-emitter homojunction homojunction serves to control the majority (electron) being emitted from the emitter into the base. That achieves an enhanced emitter injection efficiency and lowered offset voltage at the same time, as such, the invention transistor is very fit for application in digital as well as analogue circuits preconditioned by high speed, low power consumption, and high breakdown voltage performances.

8 Claims, 8 Drawing Sheets

WIDE VOLTAGE OPERATION REGIME DOUBLE HETEROJUNCTION BIPOLAR TRANSISTOR

BACKGROUND OF THE INVENTION

1. Field of the Invention

This invention relates to the structure of a Wide Voltage Operation regime Double Heterojunction Bipolar Transistor, more specifically it relates to kind of a double heterojunction bipolar transistor of a broader voltage operation Range incorporating altogether a five-period $In_{0.49}Ga_{0.51}P/GaAs$ superlatticed confinement layer and a GaAs emitter homojunction, making possible said superlatticed confinement layer functioning as a confinement layer for a minority carrier (hole), while the base-emitter homojunction serves to control the majority carrier (electron) being emitted way from the emitter into the base, thereby achieving an elevated emitter emission efficiency and lowered compensation voltage at the same time.

2. Description of the Prior Art

Over the recent years, $In_{0.49}Ga_{0.51}P/GaAs$ Heterojunction Bipolar Transistor, HBT, by reason of its unique high speed operation and current carrying capacities, has attained significant achievements and in the meantime brought about much attention in the field and study of microwave power as well as digital circuit application. While it is true that the $In_{0.49}Ga_{0.51}P/GaAs$ heterojunction conduction band discontinuity, $\Delta E_C$, is merely 200 mV, a blocking peak of that level can still leave its impact upon the current-voltage characteristics, and that resulting inevitably in a greater collector-emitter-offset voltage, $\Delta V_{CE}$, and also a greater base-emitter turn-on voltage, such that quite a number of researchers, realizing that fact, followed one another in the proposing of an $In_{0.49}Ga_{0.51}P/GaAs$ double heterojunction bipolar transistor, DHBT, with a view to resolve the problem. Since both emitter and collector are made from a same material, $In_{0.49}Ga_{0.51}P$, being structurally symmetrical, they may both acquire a relatively lower offset voltage. Also since the collector is basically of a larger energy gap material, compared with conventional type of heterojunction bipolar transistors, it exhibits a greater breakdown voltage, and as such is best fit for higher power applications. In addition, the wide band gap InGaP was also used to increase the collector-emitter breakdown voltage. Although, the typical magnitude of $\Delta E_C$ (200 mV) at InGaP/GaAs heterointerface is much smaller than that at AlGaAs/GaAs heterointerface, the $\Delta E_C$ still impedes the current-voltage characteristic under transistor operation. This should decrease the injection of electron from the emitter to the base especially in the small bias region and cause an undesired larger collector current saturation voltage (knee voltage). On the other hand, the electron blocking effect associated with $\Delta E_C$ between B-C heterojunction could cause a degraded current gain. It will also increase the collector-emitter saturation voltage, $V_{SAT}$, thus decrease the effective ranging of its normal working voltages. Shortcomings as such have by and large significantly restricted the application of conventional $In_{0.49}Ga_{0.51}P/GaAs$ heterojunction bipolar transistors in high power, high operating voltage, low power loss microwave amplification and digital circuits.

Accordingly, the afore-mentioned conventional products are still inherent with more than just one drawback, being as such, they do not qualify as the result of a good, commendable design, and need be improved somehow, the sooner the better.

In view of the many defects arising out of the structure of a conventional type double heterojunction bipolar transistor, such as those cited in the foregoing, the inventor began working for improvements sometime ago, and after years of elaborate study, has come up with a successful development of the present invention, namely, the structure of a wide voltage operation regime double heterojunction bipolar transistor

SUMMARY OF THE INVENTION

This invention is intended to provide the structure of a wide voltage operation regime double heterojunction bipolar transistor comprising $In_{0.49}Ga_{0.51}P/GaAs$ superlatticed confinement layer and GaAs emitter homojunction to realize a broader range of voltage operations. It exhibits such outstanding transistor characteristics as higher speeds, low power consumption and higher breakdown voltage ratings, and as such is fit for extensive applications in the high speed, high power amplification circuits of microwave communication products, be it for civil or national defense purposes inclusive.

In the invention embodied howsoever, on the gallium arsine substrate that forms part thereof, in particular, crystal chips grow to form a modified $In_{0.49}Ga_{0.51}P/GaAs$ double heterojunction bipolar transistor which exhibits a very wide voltage operating range for common-emitter forward active operations, highlighted in the replacement of the confinement layer of traditional or prior art heterojunction emitter bipolar transistor (HEBT) with $In_{0.49}Ga_{0.51}P/GaAs$ superlatticed confinement layer, to form instead a confinement layer for minority carriers (holes), while the effective base-emitter homojunction is employed to control the majority regime carriers(electrons), whereas on the other hand, in the collector regime, the collector is made to consist of larger energy gap InGaP. Further, a spacer layer and one layer of mono-atomic delta-doping sheet is introduced to the base-collector heterojunction, that, reinforced with a rigorously run structural parameter design, will ensure that potential spike formed from InGaP/GaAs heterojunction conduction band discontinuity will not appear at the base-emitter and base-collector heterojunction, thus making possible the realization of admirable transistor characteristics such as lowered offset voltage, higher current gain, higher breakdown voltage and a broader scope of voltage operations relevant to collector-emitter working points.

BRIEF DESCRIPTION OF THE DRAWINGS

The drawing disclose an illustrative embodiment of the present invention which serves to exemplify the various advantages and objects hereof, and are as follows.

Figure 1:
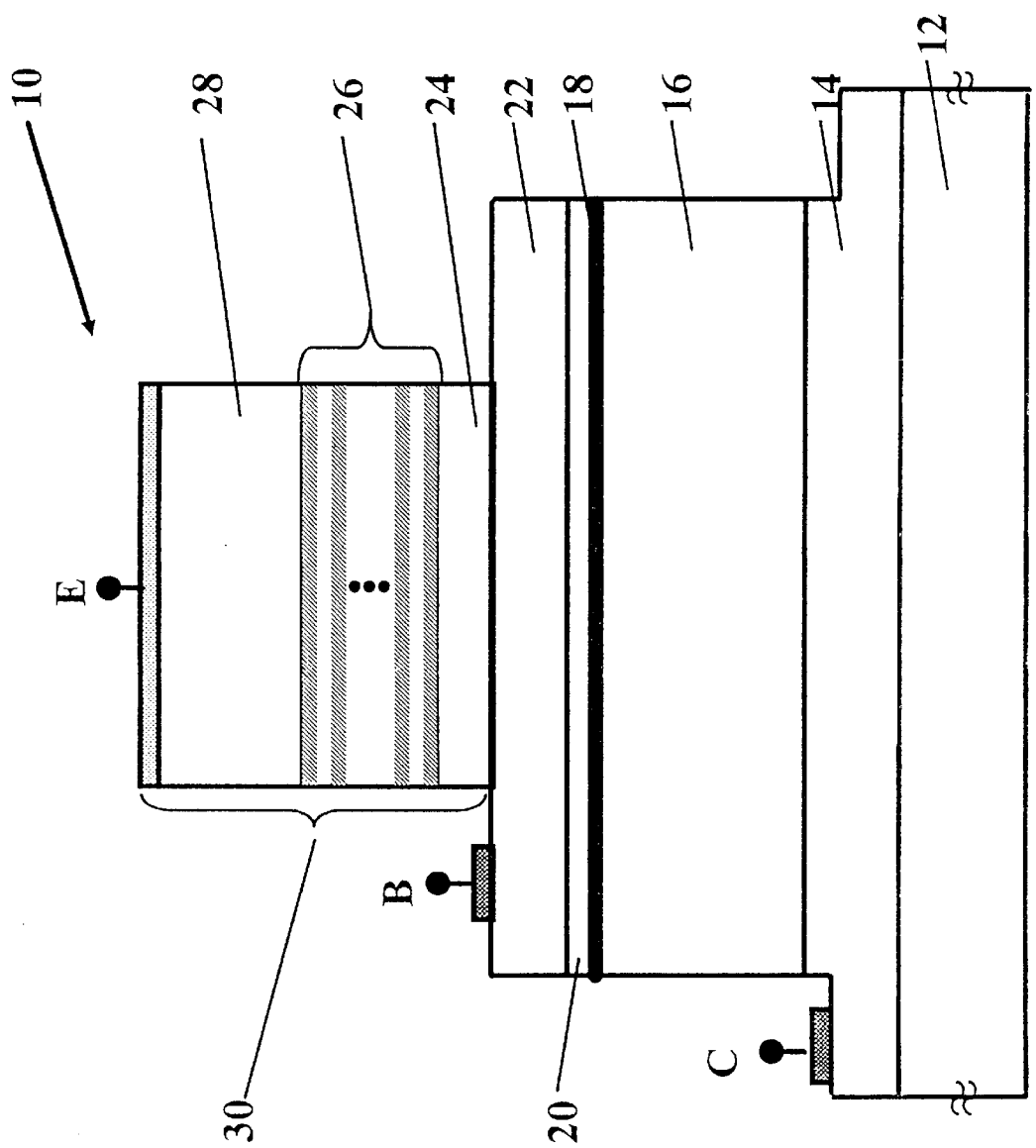
FIG. 1 is a structural layout of the present invention embodied in the context of a wide voltage operation regime double heterojunction bipolar transistor.

(Reference numbers defined for key components)
$In_{0.49}Ga_{0.51}P$/GaAs wide voltage operation regime double heterojunction bipolar transistor
12 semi-insulation GaAs substrate
14 GaAs buffer layer
16 InGaP collector layer
18 GaAs delta doping sheet
20 GaAs spatial layer
22 GaAs base layer
24 GaAs emitter layer
26 Five-period GaAs superlatticed confinement layer
28 GaAs ohmic contact layer
30 Emitter layers

DETAILED DESCRIPTION OF THE PREFERRED EMBODIMENT

Referring first of all to FIG. 1, a structure of the invention wide voltage operation regime double heterojunction bipolar transistor, the InGaP/GaAs double heterojunction bipolar transistor 10 featuring a very broad range of collector-emitter working voltage operation embodied according to the invention comprises, way up from the bottom, a semi-insulating type GaAs substrate 12; a GaAs buffer layer 14, thickness 2000 Å, concentration $n^+=5\times10^{18}$ $cm^{-3}$; a collector layer 16 composed of $In_{0.49}Ga_{0.51}P$/GaAs, thickness 5000 Å, concentration $n=1\times10^{16}$ $cm^{-3}$; a GaAs delta doping Sheet 18. concentration $\delta(n^+)=2\times10^{12}$ $cm^{-2}$; a spacer layer 20, composed of undoped GaAs, thickness 30 Å; a GaAs base layer 22, thickness 700 Å, concentration $P^+=1\times10^{19}$ $cm^{-3}$; a GaAs emitter layer 24, thickness 300 Å, concentration $n=5\times10^{17}$ $cm^{-3}$; a five-period $In_{0.49}Ga_{0.51}P$/GaAs superlatticed confinement layer 26, for which the barrier layer is formed from undoped, 50 Å thick, $In_{0.49}Ga_{0.51}P$/GaAs, and the quantum well is formed of a 50 Å thick, GaAs material, of which the concentration is $n=1\times10^{18}$ $cm^{-3}$; and a GaAs ohmic contact layer 28, thickness 3000 Å, concentration $n=1\times10^{19}$ $cm^{-3}$. This invention, in the context of a novel InGaP/GaAs double heterojunction bipolar transistor 10 having a very wide range of collector-emitter working voltage operation, as shown in FIG. 1 herein attached, is designed such that its emitter area 30 consists of a five-period $In_{0.49}Ga_{0.51}P$/GaAs superlatticed confinement layer 26, a GaAs ohmic contact layer 28, and a GaAs emitter layer 24, also such that an $In_{0.49}Ga_{0.51}P$/GaAs superlatticed confinement layer 26 is employed to substitute a prior art carrier confinement layer that is conventional in the execution of heterojunction emitter bipolar transistor (HEBT), so as to form a barrier layer to confine minority carriers (holes), whereas the base-emitter homojunction is responsible for the control of majority carriers (electrons), emitted into the base way from the emitter. So that as a result, while the transistor is in a state of normal operation, very good confinement effect to contain holes emitted way from the base towards the emitter is accomplished, in that manner the emitter emission efficiency is enhanced, whilst on the other hand, since the effective emitter-base junction is a homojunction, and the thickness of the emitter layer by design is of the order of 300 Å, that being sufficient to alleviate potential spike resulting from the $In_{0.49}Ga_{0.51}P$/GaAs heterojunction conduction band discontinuity ($\Delta E_C \approx 200$ meV), because of that, the collector-emitter offset voltage range possible through the present invention may be reduced very impressively compared with a conventionally structured heterojunction bipolar transistor.

Figure 2A:
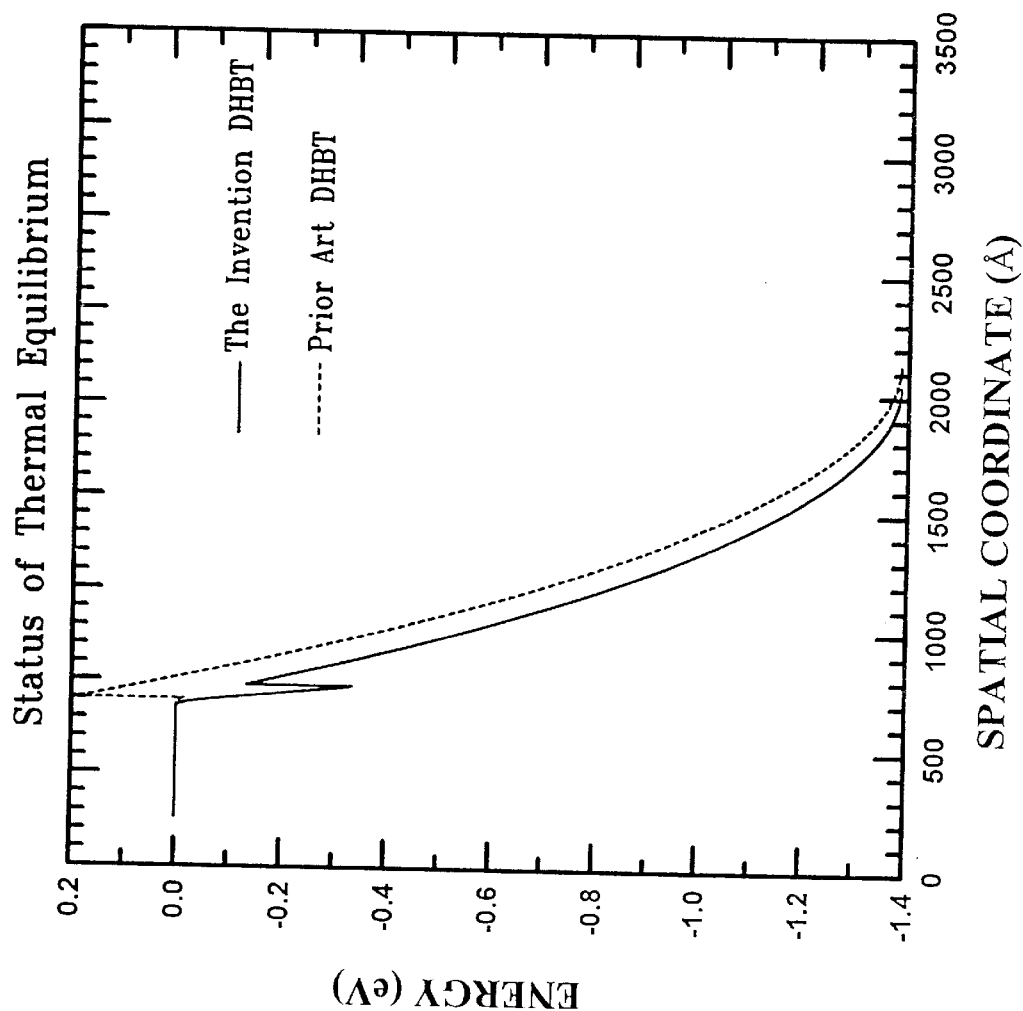
FIGS. 2a–2b are illustrations of the base-collector energy band diagram demonstrating the invention wide voltage operation regime double heterojunction bipolar transistor when (a) thermal equilibrium is reached, and (b) the transistor if operating in a forward active mode.
Figure 2B:
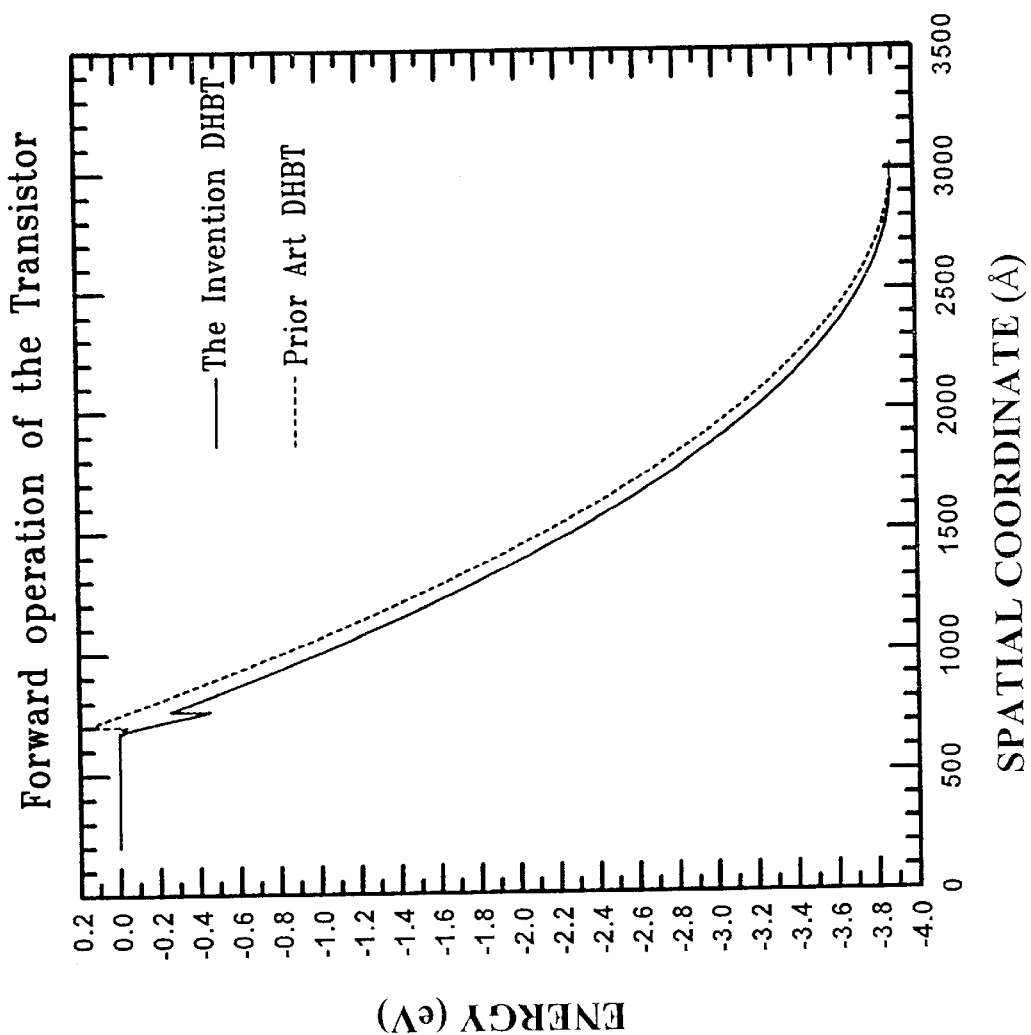
Figure 3:
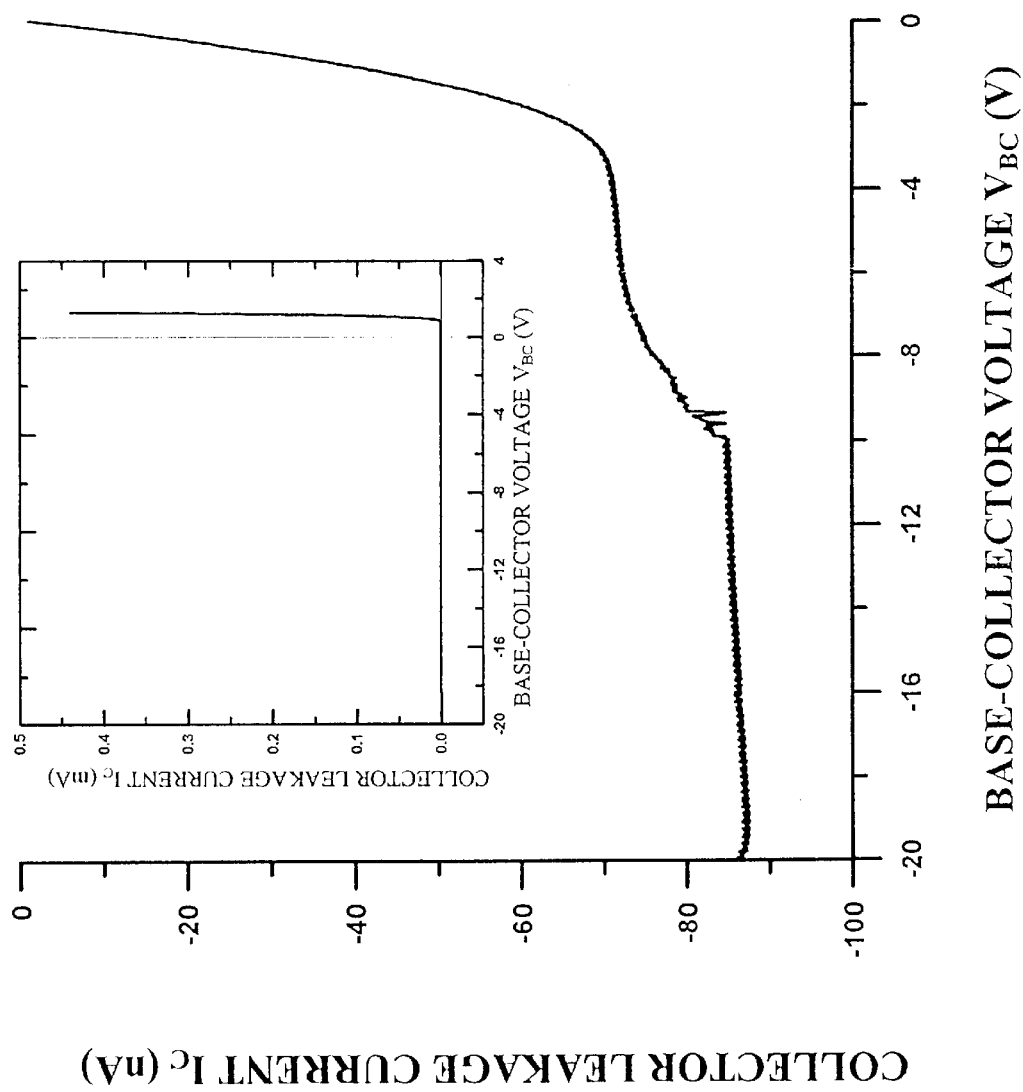
FIG. 3 is a collector-base current-voltage (I-V) characteristic representative of the invention wide voltage operation regime double heterojunction bipolar transistor.

Referring to FIG. 2, an illustration of the base-collector energy band diagram demonstrating the invention specifically, in a state of thermal equilibrium FIG. 2(a), and operating in a forward activation mode FIG. 2(b), it will be appreciated that in the case of a conventional InGaP/GaAs double heterojunction bipolar transistor (DHBT) the potential spike emerges about the base-collector interfacing, that will therefore adversely affect electron transmission effectivity, hence undermining collector's electron collecting ability, what follows then is a reduction in current gain, whilst on the other hand, the potential spike will in addition create a blocking effect to increase the collector-emitter saturation voltage, Vsat, in consequence of which the ranging of collector-emitter working point voltage operation will downgrade proportionately. By contrast, the invention structure features the introduction of a spacer and a delta-doping sheet into the base-collector heterojunction, that, in the context of a rigorously run parameter design for the overall structure, will and as it does, eliminate the potential spike about the base-collector heterojunction once for all, so that overall, this invention through its structural layout and performance specification is highlighted with a multiplicity of advantages including lower offset voltage, lower saturation voltage, a wider range of collector-emitter working voltage operation, and higher current gain Referring in continuation to FIG. 3, a collector-base current-voltage characterizing the invention wide voltage operation regime double heterojunction bipolar transistor, it should help to elucidate the excellent reverse collector-base breakdown feature by reason of the selection of a larger energy gap InGaP material for use as the collector layer gap. From the curve as shown it can be appreciated that when the transistor is working at a reverse operating voltage of 20 V, the correspondent leakage current is of the order of 86 nA only.

Figure 4A:
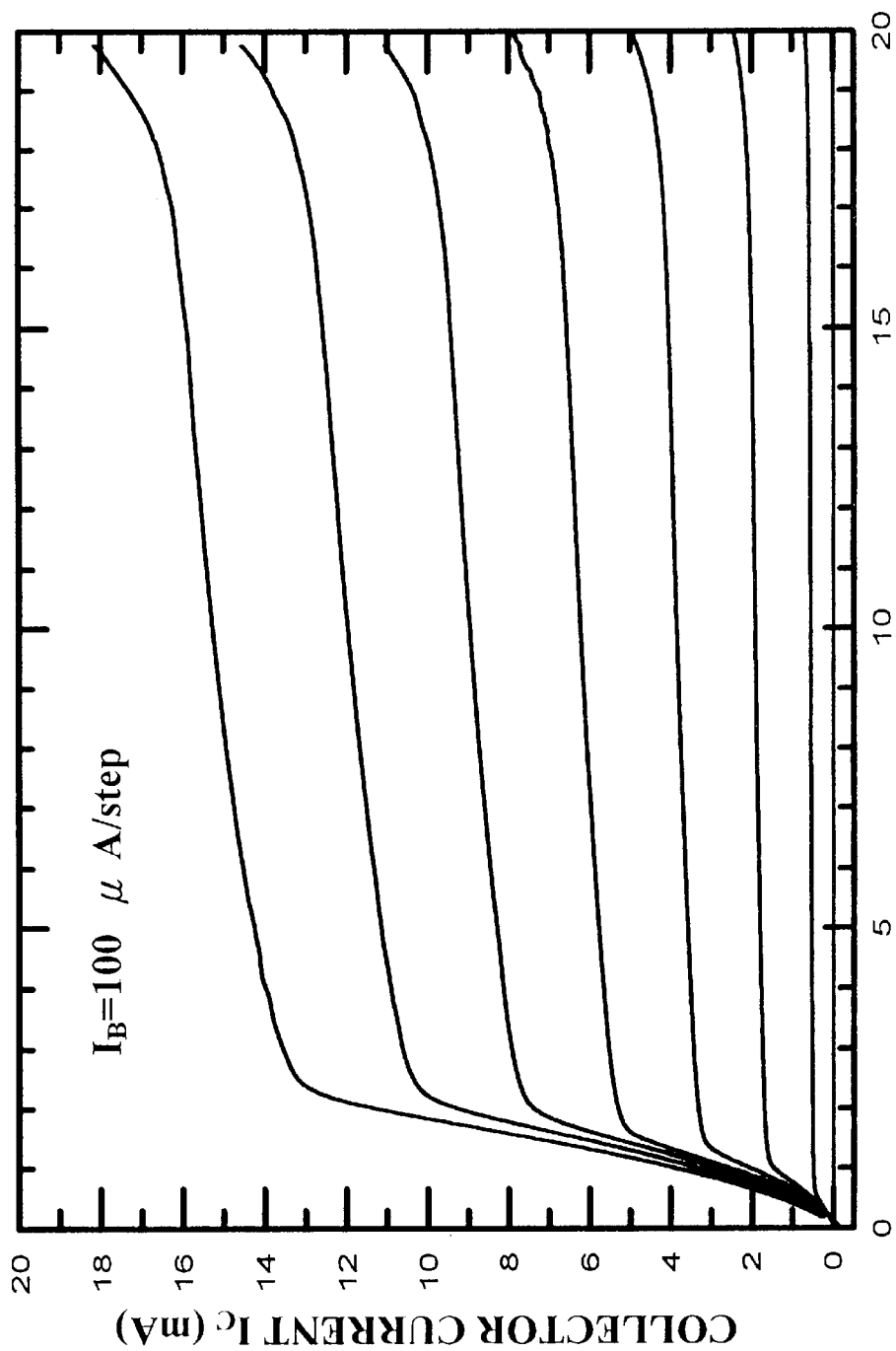
FIGS. 4a–4c show common emitter current-voltage (I-V) output characteristics measured at different collector current level, characterizing the invention wide voltage operation regime double heterojunction bipolar transistor.
Figure 4B:
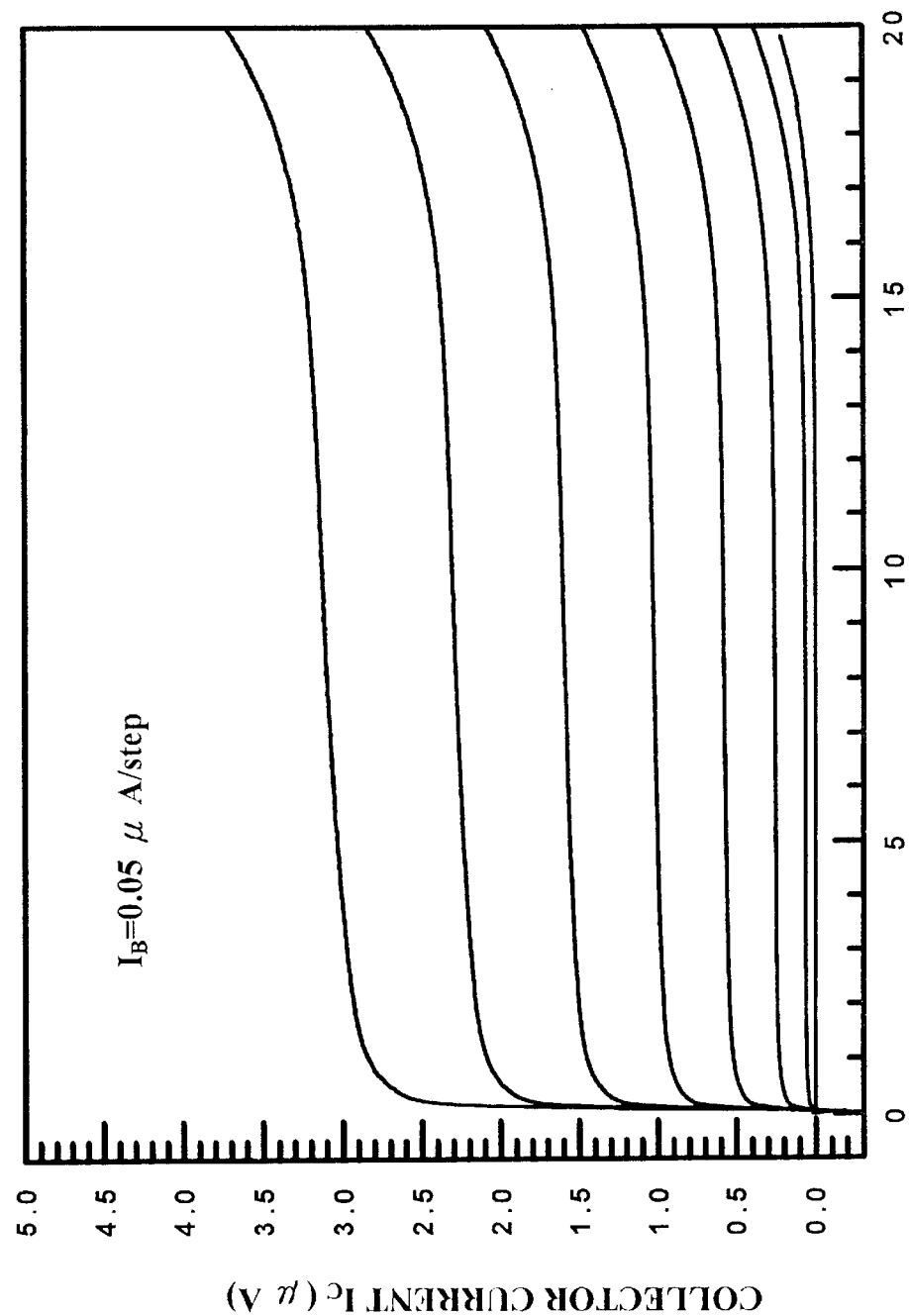
Figure 4C:
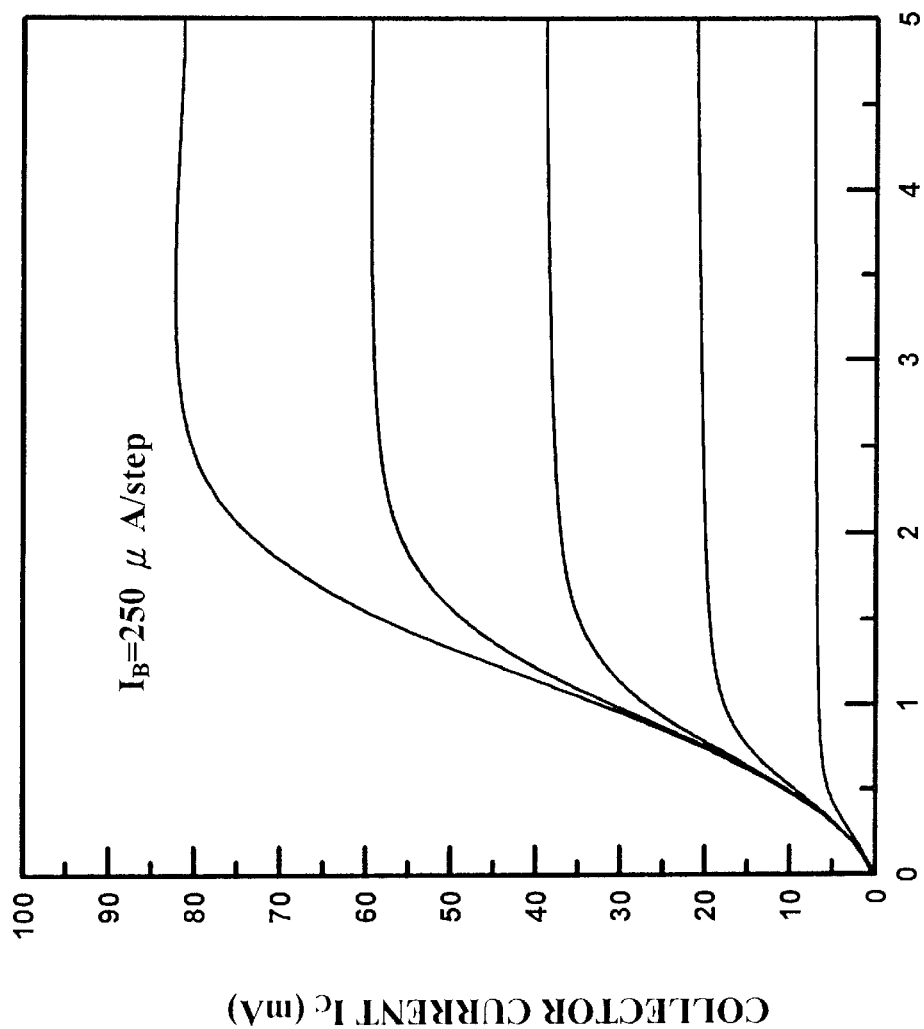

Referring next to FIG. 4, a common-emitter current-voltage output characteristics measured at different collector current levels, to characterize the invention wide voltage operation regime double heterojunction bipolar transistor, overall, since the potential spike will, in this instance, no longer appear in the base-emitter as well as base-collector heterojunction, so the offset voltage as pertinent may be maintained in a very low level, indeed less than 50 mV, and that means effective, significant reduction of the offset voltage, as can be readily appreciated by comparing with precedents recited in documentary references, for example, the offset voltage in the case of an InGaP/GaAs single heterojunction bipolar transistor (InGaP/GaAs SHBT), said to be 180 mV; and still another, the offset voltage in the case of a InGaP/GaAs double heterojunction bipolar transistor (InGaP/GaAs DHBT), said to be of the order of 57–290 mV; in addition, the introduction of a spacer and a delta-doping sheet at the base-collector heterojunction, with the electron blocking effect having been effectively eliminated, can achieve a collector-emitter saturation voltage, Vsat that is less than 1 V (when $I_C=2$ mA)(as shown in FIG. 4a). That in the execution of the embodiment of the invention, larger energy gap InGaP is used as a material for the collector, helps to increase the breakdown voltage characteristics of the invention, more specifically, where the collector-emitter breakdown voltage reaches a level as high as 20 V, the leakage current ($I_{CEO}$) is merely of the order of 217 nA. As indicated in FIG. 4b, the range of active operating collector-emitter voltage $V_{CE}$, that is, the plateau portion of collector current prior to the breakdown zone, may exceed 15 V. From FIG. 4c it may be appreciated that in the embodiment as shown, when larger current operation is in progress, while the collector current $I_C=80$ mA, the current gain attainable may exceed 90.

Figure 5:
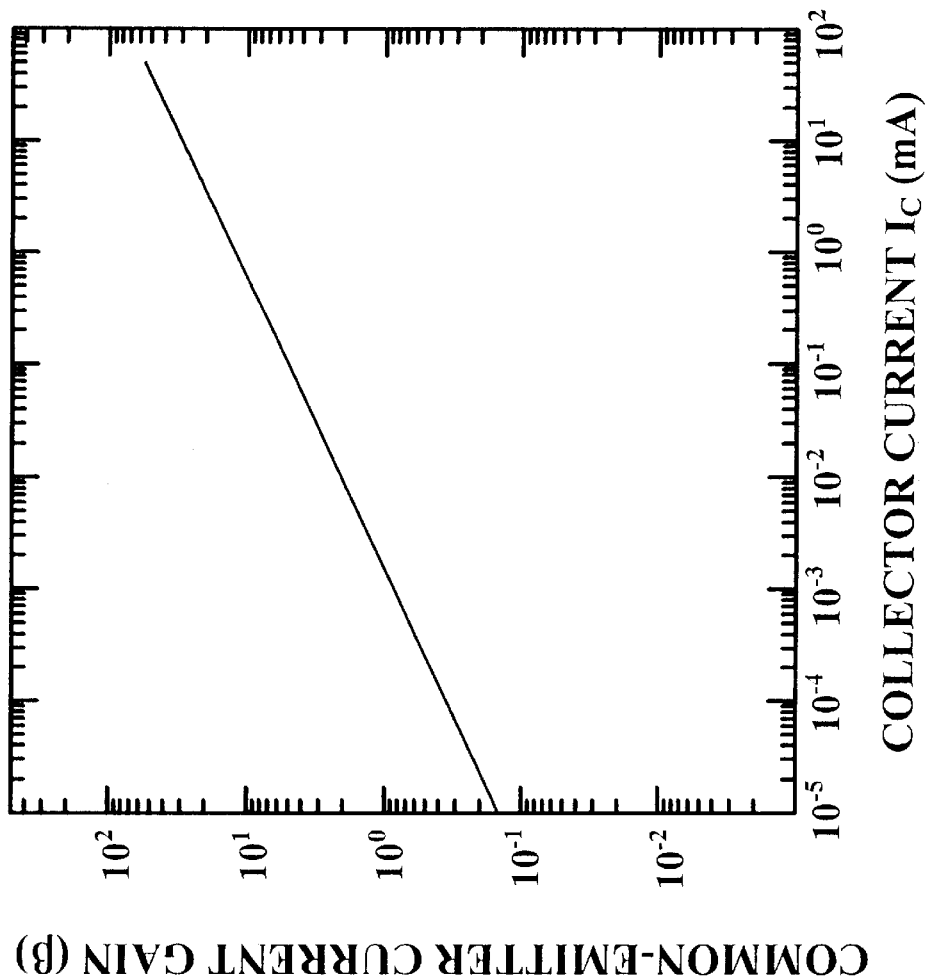
FIG. 5 is a common emitter current gain versus collector current characterizing the invention wide voltage operation regime double heterojunction bipolar transistor.

Referring to FIG. 5, a common-emitter current gain versus current curve, characterizing the invention wide voltage operation regime double heterojunction bipolar transistor it will be appreciated that that describes a state in which the collector current $I_C$=0.9 uA amplification follows in suit, meantime current gain will also increase in response to an increase in collector current, such a wholesome amplification performance is another evidence signifying the ability to effectively eliminate potential spike existent between the base-emitter and the base-collector junctions by reason of the present invention realized in execution.

Further advantages realizable with the present invention in the context of a wide voltage operation regime double heterojunction bipolar transistor over all afore-mentioned citations as well as other prior arts are summarized as follows:

The provision for the introduction of a spacer and delta doping sheet way between the base and the collector of a heterostructure-emitter bipolar transistor comprising InGaP/GaAs superlatticed confinement layer, structured such that no potential spike will emerge about the substantive base-collector interfacing, so as to fit perfectly for application in high speed, low power consumption circuits as well as high breakdown voltage circuits, so that it is made possible for original HBT hardwares to operate in high speed circuits, moreover, experimentally, it has been shown that with a subject transistor structured according to the invention, the offset voltage can be maintained at a level smaller than 50 mV, the saturation voltage less than 1 V, the breakdown voltage greater than 20 V, a range of collector-emitter working voltage operation that is greater than 15 V, for all these outstanding features realized the invention transistor is considered perfectly fit for applications in high speed, high power rating amplification circuits of radio communication products destined for both civil as well as national defense purposes.

The disclosure going thus far serves only as explanation in respect of a realizable embodiment of the invention, it is in no way meant to restrict or otherwise limit the scope of claims declared for the invention, as enclosed hereinafter, and it is to be noted that all variants or modifications executed to the extent not departing from the spirit of the art disclosed herein should be deemed contained in the passage of claims enclosed hereinafter.

Briefly, the invention submitted hereunder for your examination has been shown to be technologically innovational, by far more advantageous than peer prior arts known to this date, it is therefore brought to your highly esteemed office for a judicious, unprejudiced evaluation.

REFERENCES CITED (1) Y. K. Chen. R. Rapre, W. T. Tsang and M. C. Wu, Electron. Lett., Vol 28, No. 13, (1992), pp. 1228–1229.
(2) A. H. Hanson, S. T. Stockman and G. E. Stillman, IEEE Electron Device Lett., Vol. 14, No. 1, (1993), pp. 25–28
(3) F. Ren, C. R. Abernathy. S. J. Pearton. P. W. Wisk and R. Esagui, Electron. Lett., Vol. 28, No. 12, (1992), pp. 1150–1151.
(4) M. J. Mondry and H. Kronemer, IEEE Electron Device Lett., Vol. 6, No. 4, (1985), pp. 1881–1883.
(5) J. I. Song, C. Caneau, W. P. hong and K. B. Chough, Electron. Lett., Vo. 29, No. 21, (1993), pp. 1881–1883.
(6) W. C. Liu and W. S. Lour, IEEE Electron Device Lett , 12 (1991) 474.
(7) W. C. Liu, s. Y. Cheng, J. H. Tsai, P. H. Lin, J. Y. Chen and W. C. Wang, IEEE Electron Device Lett., 18 (1997) 515.
(8) T. Won, and H. Morkoc. IEEE Electron Device Lett., 10 (1999) 138.
(9) A. W. Hanson, S. A. Stockman, and G. E. Stillman 1993 IEEE Electron Device Lett. 1425.
(10) W. Liu, A. C. Seabaugh, T. S. Henderson, A. Yuksel, E. A. Beam III, and S. K. Fan 1993 IEEE Trans. Electron Devices, 40 1384.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A wide voltage operation regime double heterojunction bipolar transistor comprising:
    a substrate comprised of GaAs material;
    a buffer layer comprised of GaAs material on said substrate;
    a collector layer comprised of $In_{0.49}Ga_{0.51}P$ material on said buffer layer;
    a base layer comprised of GaAs material on said collector layer;
    an emitter layer comprised of GaAs material on said base layer;
    a five-period superlatticed confinement layer on said emitter layer, said confinement layer comprising a barrier layer formed from undoped $In_{0.49}Ga_{0.51}P$ material and a quantum well layer formed from GaAs material; and
    an ohmic contact layer comprised of GaAs material on said five-period superlatticed confinement layer.

2. The wide voltage operation regimine double heterojunction bipolar transistor according to claim 1, wherein said collector layer is comprised of n$^+$type GaAs material.

3. The wide voltage operation regime double heterojunction bipolar transistor according to claim 1, wherein said collector layer further comprises a GaAs delta doping sheet and an undoped GaAs spacer.

4. The wide voltage operation regime double heterojunction bipolar transistor according to claim 3, wherein said delta doping sheet is comprised of n$^+$type GaAs material.

5. The wide voltage operation regime double heterojunction bipolar transistor according to claim 1, wherein said base layer is comprised of p$^+$type GaAs material.

6. The wide voltage operation regime double heterojunction bipolar transistor according to claim 1, wherein said superlattice confinement layer is formed from one superlatticed confinement layer and one homojunction emitter layer material.

7. The wide voltage operation regime double heterojunction bipolar transistor according to claim 6, wherein said homojunction emitter layer material is comprised of n$^+$type GaAs material.

8. The wide range voltage operation regime double heterojunction bipolar transistor according to claim 16, wherein said ohmic contact layer is formed from n$^+$type GaAs materials.

* * * * *